United States Patent [19]
Lee et al.

[11] Patent Number: 5,828,762
[45] Date of Patent: Oct. 27, 1998

[54] APPARATUS FOR COMPENSATING AUDIO SIGNAL RECORDING

[75] Inventors: Hai-wook Lee, Suwon, Rep. of Korea; Igor G. Vikulov, Ljuberzy, Russian Federation

[73] Assignee: Samsung Electronics Co., Ltd., Kyungki-Do, Rep. of Korea

[21] Appl. No.: 794,020

[22] Filed: Feb. 3, 1997

[30] Foreign Application Priority Data

Nov. 9, 1996 [KR] Rep. of Korea .................. 1996 53083

[51] Int. Cl.$^6$ ..................................................... H04B 15/00
[52] U.S. Cl. .......................... 381/94.8; 381/102; 381/104; 360/66
[58] Field of Search .................................. 381/94.3, 94.8, 381/104, 102, 106, 107; 360/66

[56] References Cited

U.S. PATENT DOCUMENTS 4,208,548  6/1980  Orban .
4,241,266  12/1980  Orban .
5,168,526  12/1992  Orban .

*Primary Examiner*—Forester W. Isen
*Attorney, Agent, or Firm*—Sughrue, Mion, Zinn, Macpeak & Seas, PLLC

[57] ABSTRACT

An audio signal recording compensation apparatus enhances a frequency characteristic and prevents saturation of a recording signal by controlling the level of the recording signal when an audio signal is recorded. The audio signal recording compensation apparatus includes a high-pass filter (32) for passing only a high-frequency component of a recording signal. A clipper (34) generates a clipped signal by cutting off the high-pass filtered recording signal beyond predetermined amplitude levels. An adder (36) generates a compensation recording signal by superimposing the clipped signal and the recording signal. In the apparatus, a high frequency component is emphasized without distortion of the recording signal by controlling the level of the high frequency components of the recording signal, thereby improving the frequency characteristic.

8 Claims, 2 Drawing Sheets

APPARATUS FOR COMPENSATING AUDIO SIGNAL RECORDING

BACKGROUND OF THE INVENTION

The present invention relates to an apparatus for recording an audio signal. More particularly, it relates to an audio signal recording compensation apparatus for enhancing a frequency characteristic and preventing saturation of a recording signal by controlling the level of the recording signal when an audio signal is recorded. This application for an apparatus for compensating audio signal recording is based on Korean Patent Application No. 96-53083 which is incorporated by reference herein for all purposes.

In general, the size of a recording signal level during recording of audio signals affects distortion of a signal and a signal-to-noise (S/N) ratio during reproduction.

FIG. 1 shows the relationship between a level of a recording input signal and that of a reproducing output signal. In FIG. 1, when the recording level exceeds a predetermined value, linearity disappears between the levels of the recording input signal and the reproducing output signal. When this happens the recording level is saturated. Thus, when the level of the recording signal is increased over a predetermined value, distortion is generated during reproduction. Also, since the level of the recording signal is proportional to S/N ratio, when the level of the recording signal is lowered, the S/N ratio is lowered.

FIG. 2 shows a frequency characteristic of an equalizer during recording. As can be seen from the drawing, gain is increased in proportion to a frequency in a high frequency range above a predetermined frequency.

Accordingly, in a conventional technique of recording an audio signal, the S/N ratio is increased without distortion of the signal by increasing the recording level of the audio signal to just below the point at which it would become saturated.

In the recording of the audio signal using the above-described conventional art there are certain problems. When the level of an input signal to be recorded is low, the S/N ratio is degraded. When the level of an input signal to be recorded is extremely high, saturation occurs in a high frequency range during recording so that distortion is generated in a reproduced signal.

SUMMARY OF THE INVENTION

To solve the above problems, it is an object of the present invention to provide an audio signal recording compensation apparatus for enhancing a frequency characteristic and preventing saturation in a high frequency range by controlling the level of a recording signal during recording.

To accomplish the above object, there is provided an audio signal recording compensation apparatus comprising a high-pass filter for passing only a high-frequency component of a recording signal, a clipper for generating a clipped signal by cutting off the high-pass filtered recording signal above a predetermined level, and an adder for generating a compensation recording signal by superimposing the clipped signal and the recording signal.

It is preferable that the clipper comprises three resistors R11, R10 and R9 connected in series between a predetermined power supply source and the ground, two capacitors C5 and C6, connected between the ground and two nodes between the resistors, for connecting the three resistors, and two diodes D1 and D2 for connecting the two nodes in parallel to the input port of the clipper with the two diodes being connected to have different polarities.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1:
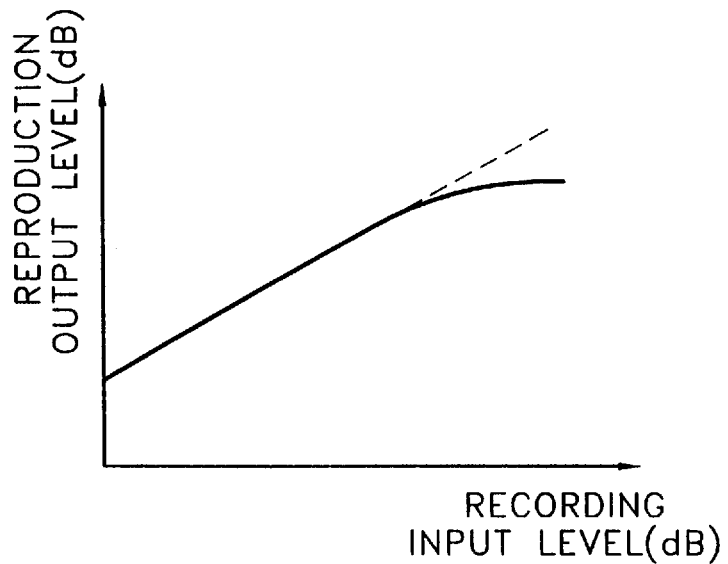
FIG. 1 is a graph showing the relationship between a recording input level and a reproducing output level.
Figure 2:
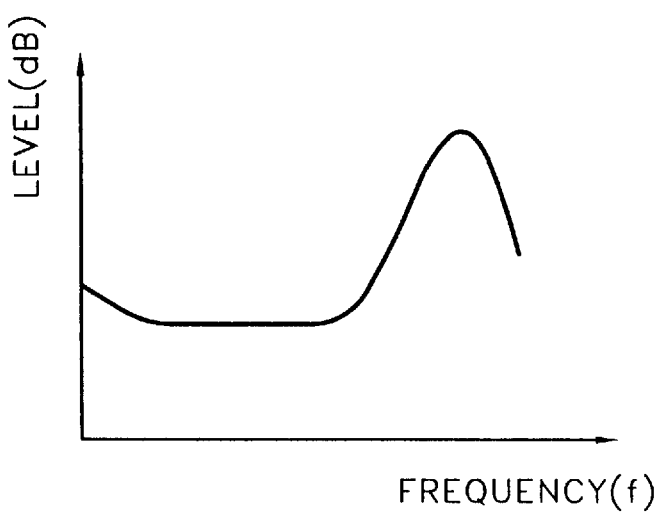
FIG. 2 is a graph showing a frequency characteristic of an equalizer for shaping the frequency distribution of an audio signal which is to be recorded.
Figure 3:
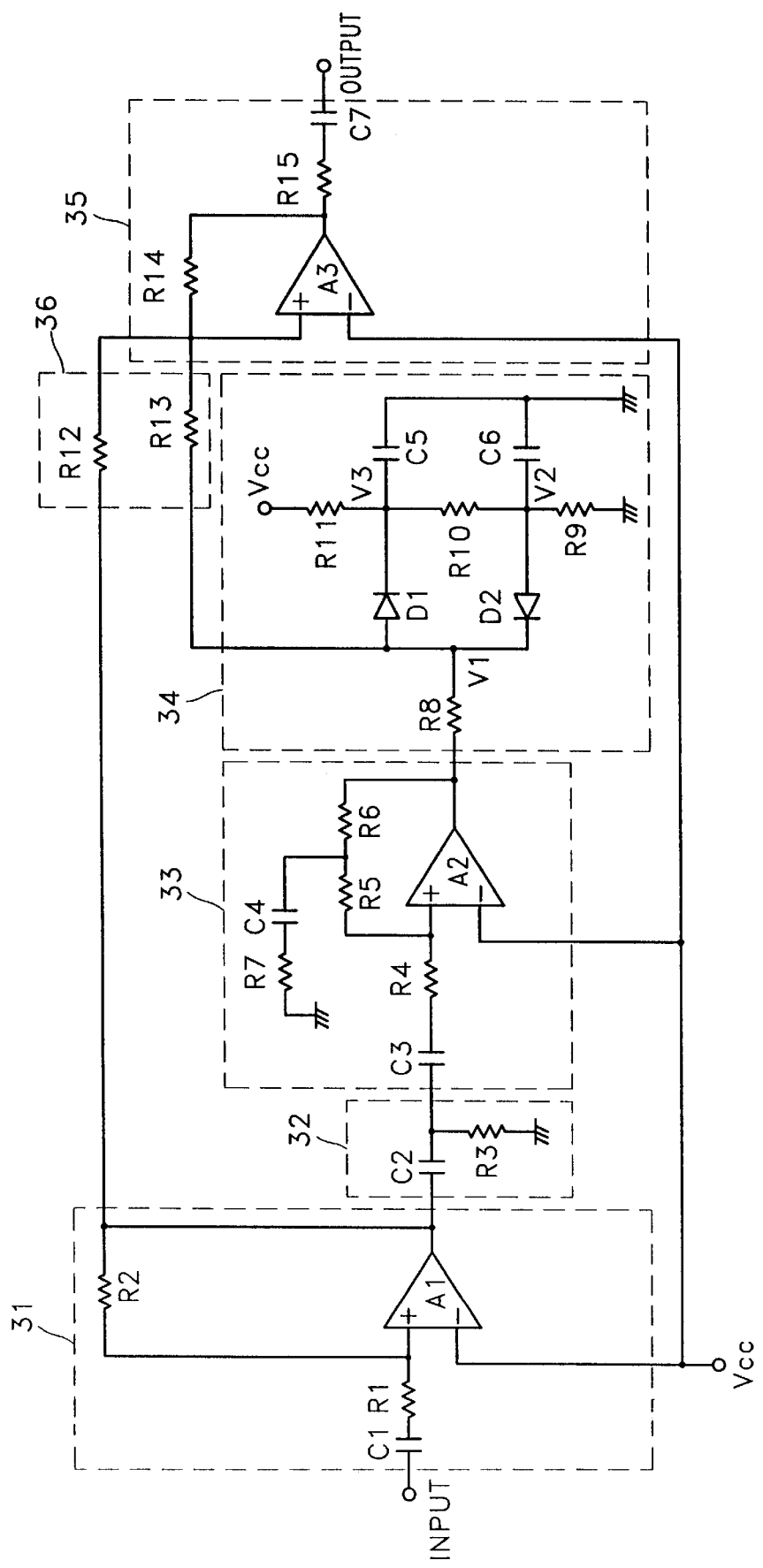
FIG. 3 is a circuit diagram of an audio signal recording compensation apparatus according to the present invention.

Referring to FIG. 3, an audio signal recording compensation apparatus according to an embodiment of the present invention includes a first amplifier 31 for amplifying a recording signal to a predetermined gain value. A high-pass filter 32 passes only a high frequency range portion of the firstly amplified input signal, and a second amplifier 33 nonlinearly amplifies the high-pass filtered signal without phase shifting it. A clipper 34 passes only those portions of secondly amplified signal which fall between predetermined levels. Adder 36 superposes the signals output from the first amplifier 31 and the clipper 34. A third amplifier 35 amplifies the superposed signal according to a predetermined gain value.

The first amplifier 31 is comprised of an operational amplifier A1, resistors R1 and R2, and a capacitor C1. It amplifies the level of an audio signal to be recorded to have a predetermined gain and outputs the amplified signal.

The high-pass filter 32 is comprised of a capacitor C2 and a resistor R3. It receives the amplified signal output from the first amplifier 31 and passes only the high frequency components of the signal while blocking the middle and low frequency components thereof. The high-pass filter 32 is for compensating the level of the recording signal in a high frequency range.

The second amplifier 33 is comprised of an operational amplifier A2, resistors R4 to R7, and capacitors C3 and C4. It has a nonlinear amplification characteristic such that the input recording signal passed through the high-pass filter 32 is amplified without phase shifting.

The clipper 34 is comprised of diodes D1 and D2, resistors R8 to R11, and capacitors C5 and C6. It receives the signal output from the second amplifier 33 and passes only a signal between predetermined levels to output the passed signal as a clipped signal.

To be more specific, the output of a signal applied to the diodes in the clipper 34 is determined by comparing a voltage V1 of the input port with voltages V2 and V3 divided by the resistors R11, R10 and R9. That is, when a value of the input voltage V1 is less than that of the voltage V2 by a voltage of 0.6V or less, the diode D2 becomes conductive so that the high-frequency-range recording signal flows to the ground through the capacitor C6. When the value of the input voltage V1 is greater than that of the voltage V3 by a voltage of 0.6V, the diode D1 becomes conductive so that the high-frequency-range recording signal flows to the ground through the capacitor C5. Therefore, the clipper 34 outputs only the high-frequency-range recording signal between predetermined levels to the adder 36 as a clipped signal.

The adder 36 is comprised of resistors R12 and R13, and superposes the output signals of the clipper 34 and the first amplifier 31 through the respective resistors R13 and R12. When the input recording signal has only middle- and low-frequency components, the entire recording signal is cut off by the high-pass filter 32. Thus, no recording signal is output from the clipper 34 and only the output signal of the first amplifier 31 is input to the adder 36.

However, when the input recording signal includes high frequency components and has a size between predetermined levels, the output signal of the clipper 34 exists and is superposed with the output signal of the first amplifier 31 having amplified the original recording signal, and then applied to the third amplifier 35.

The third amplifier 35 receives the output signal of the adder 36, amplifies the input signal to have a predetermined gain and outputs the amplified signal.

Consequently, the recording signal having passed an equalizer by such operations is input and the level of the input recording signal is not compensated when the recording signal has only the middle and low frequency components. When the recording signal includes a high-frequency-range signal, only the high-frequency-range signal between predetermined levels is detected and superposed onto the original recording signal, thereby compensating the level of the recording signal. However, since a recording signal greater than the predetermined level among high-frequency-range recording signals can be saturated during the superposition, the level of the recording signal is not compensated.

Therefore, during recording, the level of a high-frequency-range signal is emphasized within a range where saturation does not occur and synthesized with the original recording signal, thereby compensating the frequency characteristic in a high-frequency-range.

As described above, according to the present invention, high-frequency components are emphasized without distortion of a recording signal by controlling the level of the high frequency components of the recording signal, thereby improving the frequency characteristic.

Although a preferred embodiment of the invention has been described herein, it will be appreciated that various modifications may be made to the described embodiment without departing from the scope and spirit of the invention.

What is claimed is:

1. An audio signal recording compensation apparatus comprising:
    a high-pass filter for passing only a high-frequency component of an audio signal to be recorded to produce a high-pass filtered signal;
    a clipper for generating a clipped signal by cutting off said high-pass filtered signal beyond predetermined amplitude levels; and
    an adder for generating a compensation recording signal by superimposing said clipped signal and said audio signal to be recorded.

2. The audio signal recording compensation apparatus as claimed in claim 1, further comprising:
    a nonlinear amplifier for amplifying said high-pass filtered signal to have a predetermined gain without phase shifting;
    wherein said clipper receiving said high-pass filtered signal after it has been amplified by said nonlinear amplifier.

3. The audio signal recording compensation apparatus as claimed in claim 1, wherein said clipper has at least two diodes, and clips the high-pass filtered signal using switching characteristics of said diodes.

4. The audio signal recording compensation apparatus as claimed in claim 1, wherein said clipper has an input port at which said high-pass filtered signal is received, said clipper comprising:
    first, second, and third resistors connected in series between a predetermined power supply source and the ground, to form a first node at a series connection of the first resistor to the second resistors and a second node at a series connection of the second resistor with the third resistor;
    two capacitors, one of said capacitors being connected between ground and said first node and the other one of said capacitors being connected between ground and said second node; and
    first and second diodes, said first diode being connecting in a first polarity between said first node and said input port, said second diode being connecting in a second polarity between said second node and said input port, said first polarity being different from said second polarity.

5. An audio signal recording compensation apparatus comprising:
    a high-pass filter which has a characteristic of passing only a high-frequency component of an audio signal to be recorded, so as to produce a high-pass filtered signal;
    a clipper, receiving said high-pass filtered signal as an input, having a clipped signal as an output, said clipped signal being formed by cutting off said high-pass filtered signal beyond predetermined amplitude levels; and
    an adder, receiving said clipped signal and said audio signal as inputs, having as an output a compensation recording signal formed by superimposing said clipped signal and said audio signal to be recorded.

6. The audio signal recording compensation apparatus as claimed in claim 5, further comprising:
    a nonlinear amplifier having the characteristic of amplifying at a predetermined gain without phase shifting;
    wherein said nonlinear amplifier receives said high-pass filtered signal as an input and said clipper receives said high-pass filtered signal after it has been amplified by said nonlinear amplifier.

7. The audio signal recording compensation apparatus as claimed in claim 5, wherein said clipper has at least two diodes, and clips the high-pass filtered signal using switching characteristics of said diodes.

8. The audio signal recording compensation apparatus as claimed in claim 5, wherein said clipper has an input port at which said high-pass filtered signal is received, said clipper comprising:
    first, second, and third resistors connected in series between a predetermined power supply source and the ground, to form a first node at a series connection of the first resistor to the second resistors and a second node at a series connection of the second resistor with the third resistor;
    two capacitors, one of said capacitors being connected between ground and said first node and the other one of said capacitors being connected between ground and said second node; and
    first and second diodes, said first diode being connecting in a first polarity between said first node and said input port, said second diode being connecting in a second polarity between said second node and said input port, said first polarity being different from said second polarity.

* * * * *